US007697198B2

(12) United States Patent
Shafer et al.

(10) Patent No.: US 7,697,198 B2
(45) Date of Patent: Apr. 13, 2010

(54) CATADIOPTRIC PROJECTION OBJECTIVE (75) Inventors: David Shafer, Fairfield, CT (US);
Alexander Epple, Aalen (DE); Aurelian Dodoc, Oberkochen (DE); Wilhelm Ulrich, Aalen (DE); Karl-Heinz Schuster, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 474 days.

(21) Appl. No.: 10/576,265

(22) PCT Filed: Oct. 15, 2004

(86) PCT No.: PCT/EP2004/011587

§ 371 (c)(1),
(2), (4) Date: May 22, 2007

(87) PCT Pub. No.: WO2005/040890

PCT Pub. Date: May 6, 2005

(65) Prior Publication Data

US 2008/0037111 A1 Feb. 14, 2008

Related U.S. Application Data

(60) Provisional application No. 60/511,673, filed on Oct. 17, 2003.

(51) Int. Cl.
*G02B 17/08* (2006.01)
(52) U.S. Cl. ........................................ 359/365; 355/67
(58) Field of Classification Search ......... 359/364–366, 359/726–734; 355/67
See application file for complete search history.

(56) References Cited

U.S. PATENT DOCUMENTS

| 5,636,066 | A | 6/1997 | Takahashi |
| 5,861,997 | A | 1/1999 | Takahashi |
| 6,995,930 | B2* | 2/2006 | Shafer et al. ................. 359/727 |
| 7,426,082 | B2* | 9/2008 | Shafer et al. ................. 359/727 |
| 2005/0185269 | A1* | 8/2005 | Epple et al. ................. 359/366 |
| 2006/0158720 | A1 | 7/2006 | Chuang et al. |
| 2007/0297047 | A1 | 12/2007 | Yuuki et al. |

FOREIGN PATENT DOCUMENTS

DE   31 30 239 A1   6/1982

(Continued)

OTHER PUBLICATIONS

M. Bal, Dissertation, "Next-Generation Extreme Ultraviolet Lithographic Projection Systems", chapter 6 ("New EUV projection system designs"), pp. 85-96, published Feb. 10, 2003.

*Primary Examiner*—Alessandro Amari
*Assistant Examiner*—Mark Consilvio
(74) *Attorney, Agent, or Firm*—Sughrue Mion, PLLC (57) ABSTRACT A catadioptric projection objective for projecting a pattern arranged in the object plane of the projection objective into the image plane of the projection objective, having: a first objective part for projecting an object field lying in the object plane into a first real intermediate image; a second objective part for generating a second real intermediate image with the radiation coming from the first objective part; a third objective part for generating a third real intermediate image with the radiation coming from the second objective part; and a fourth objective part for projecting the third real intermediate image into the image plane.

14 Claims, 9 Drawing Sheets

FOREIGN PATENT DOCUMENTS

| | | |
|---|---|---|
| EP | 1191378 A1 | 3/2002 |
| JP | 2002372668 | 12/2002 |
| JP | 2004317534 | 11/2004 |
| JP | 2005107362 A * | 4/2005 |
| WO | WO 02/103431 A1 | 12/2002 |
| WO | WO 03/036361 A1 | 5/2003 |

* cited by examiner

CATADIOPTRIC PROJECTION OBJECTIVE

BACKGROUND OF THE INVENTION

This application is a National Stage of International Application No. PCT/EP2004/011587 filed Oct. 15, 2004, which claims the benefit of U.S. Provisional Application No. 60/511,673, filed Oct. 17, 2003.

1. Field of the Invention

The invention relates to a catadioptric projection objective for projecting a pattern arranged in the object plane of the projection objective into the image plane of the projection objective.

2. Description of the related Prior Art

Such projection objectives are used in microlithography projection exposure systems in order to produce semiconductor components and other finely structured components. Their purpose is to project patterns of photomasks or lined plates, which will be generically referred to below as masks or reticles, onto an substrate coated with a photosensitive layer with maximal resolution on a reducing scale.

In order to generate finer and finer structures, it is then necessary on the one hand to increase the numerical aperture (NA) of the projection objective on the image side and, on that the other hand, to use shorter and shorter wavelengths, preferably ultraviolet light with wavelengths of less than about 260 nm, for example 248 nm, 193 nm or 157 nm.

Purely refractive projection objectives have primarily been used to date in optical lithography. They are distinguished by a mechanically quite simple, centered construction which has only a single optical axis. It is also possible to use object fields centered on the optical axes, which minimize the etendue to be corrected and simplify alignment of the objective.

The form of the refractive design, however, is substantially constrained by two elementary image errors: the chromatic correction and the correction of the Petzval sum (image field curvature).

If only one refractive material is used (generally SiO2 for 193 nm, CaF2 for 157 nm) then the opportunity to correct the chromatic errors is very restricted. Full achromatization cannot be carried out. The best design compromise is then achieved by selecting single-waist designs with a small first convexity a large second convexity.

The correction of the Petzval condition (image field planarization) imposes the characteristic waist structure on the objective and entails very large maximum lens diameters, which increase the blank mass (mass of the lens material parts needed for the lens production). Once the waist structure has been established, then mass-optimized designs are obtained by trying to match the maximum diameters to one another in the first and second convexities. But this conflicts with the correction of the transverse chromatic aberration.

Simpler correction of the Petzval condition and an opportunity for chromatic correction are achieved with catadioptric designs. Here, the Petzval correction is achieved by the curvature of the concave mirror, and the chromatic correction is achieved by the refractive power of the negative lenses in front of the concave mirror (for CHL) and the aperture position with respect to the concave mirror (CHV).

A disadvantage of the catadioptric design, however, is that it is necessary to operate either with off-axial object fields, that is to say an increased etendue (in systems with geometrical beam splitting) or with physical beam splitter elements, which generally cause problems with the polarization.

In off-axial catadioptric systems, the requirements for the optical design may be formulated as follows: (1) minimize the etendue, (2) configure the geometry of the folding (beam deviations or deflections) so that a mounting technique can be developed for it and (3) correct the Petzval sum and the chromatic aberrations together in the catadioptric mirror group.

In order to keep the etendue small, the folding of the design should in principal take place in the low-NA region (that is to say in the vicinity of the object, for example) and in the vicinity of openings (that is to say close to the reticle or a real intermediate image).

As the numerical aperture rises, however, the numerical aperture on the object side and therefore the distance of the first fold from the reticle also increase, so that the etendue becomes greater. The diameter of the concave mirror and the size of the folding mirror are also increased. This can lead to problems with availability of space.

This can be remedied by firstly projecting the reticle onto an intermediate image by a first refractive relay system and by forming the first fold in the vicinity of the intermediate image. Such a catadioptric system is disclosed in EP 1 191 378 A1. It has a catadioptric objective part with the concave mirror. The light travels from the object plane onto a deflecting (folding) mirror placed in the vicinity of the first intermediate image, from there to the concave mirror and from the latter, while producing a second real intermediate image in the vicinity of a second deflecting mirror, into a refractive objective part which projects the second intermediate image onto the image plane (wafer).

A system with a similar structure is disclosed in WO 03/036361 A.

A catadioptric projection objective with a long, multi-lens relay objective for generating a first intermediate image, a polarization beam splitter, a catadioptric objective part with a concave mirror for generating a second real intermediate image, and a refractive objective part for projecting the second intermediate image onto the image plane, is disclosed in U.S. Pat. No. 5,861,997.

A disadvantage of such systems, however, is that the second refractive part again introduces chromatically and Petzval-undercorrected elements which need to be compensated for in the catadioptric part.

Other catadioptric systems with two real intermediate images are disclosed in JP 2002-372668 and Patent U.S. Pat. No. 5,636,066.

SUMMARY OF THE INVENTION

It is an object of the invention to provide a catadioptric projection objective which, with a favorable design, allows good correction of image errors. In particular, it should be possible to correct the Petzval sum and the chromatic aberrations under conditions which are favorable in terms of manufacturing technology.

This object is achieved by a catadioptric projection objective which, according to one of formulation of the invention, has a first objective part for projecting the object field into a first real intermediate image, a second objective part for generating a second real intermediate image with the radiation coming from the first objective part, a third objective part for generating a third real intermediate image with the radiation coming from the second objective part and a fourth objective part for projecting the third real intermediate image into the image plane.

Such a catadioptric projection objective thus has at least three real intermediate images. In preferred systems, the third intermediate image is projected into the image plane directly, that is to say without generating other intermediate images. Systems with exactly three real intermediate images can therefore be favorable.

The first objective part may be used as a relay system in order to generate a first intermediate image with a predeterminable correction state at a suitable position using the radiation coming from the object plane.

Preferably, at least two of the objective parts are catadioptric and each have a concave mirror. In particular, exactly two catadioptric objective parts may be provided.

In one refinement, the second objective part and the third objective part are designed as catadioptric systems, each having a concave mirror. A mirror surface may be assigned to each of the concave mirrors in order either to deviate the radiation toward the concave mirror or to deviate the radiation coming from the concave mirror in the direction of a subsequent objective part. For the beam deviation, depending on the exemplary embodiment, it is for example possible to use fully reflecting mirror surfaces (geometrical beam splitting), totally reflecting mirror surfaces (geometrical beam splitting) or polarization-selective mirror surfaces (physical beam splitting). Preferably, the fourth objective part is purely refractive and can be optimized in order to generate high image-side and numerical apertures (NA).

The provision of at least two catadioptric subsystems has great advantages. In order to understand the essential disadvantages of systems with only one catadioptric subsystem, it is necessary to consider the way in which the correction of the Petzval sum and the chromatic aberrations is carried out in a catadioptric part. The contribution of a lens to the longitudinal chromatic aberration CHL is given by $$CHL \propto h^2 \cdot \phi \cdot v$$

that is to say it is proportional to (the second power of) the peripheral beam height h, the refractive power $\phi$ of the lens and the dispersion $v$ of the material. On the other hand, the contribution of a surface to the Petzval sum depends only on the surface curvature and the refractive index change (which is −2 for a mirror).

In order to make the contribution of the catadioptric group to the chromatic correction large, it is thus necessary to have large peripheral beam heights (that is to say large diameters), and in order to make the contribution to the Petzval correction large it is necessary to have large curvatures (that is to say small radii, which are most expediently achieved with small diameters). These two requirements are in conflict with each other.

The competing requirements for Petzval correction (that is to say correction of the image field curvature) and chromatic correction can be resolved by introducing (at least) one other catadioptric part into the system.

Now, the two catadioptric systems can be designed so that one tends toward large diameters with flat radii for the CHL correction, and the other tends toward small diameters with acute radii for the Petzval correction.

In general, the degree of freedom is available to distribute the correction of this and other image errors uniformly or nonuniformly among two (or more) catadioptric subsystems. This makes it possible to obtain a maximal apertures with an outstanding correction state in a relaxed structure.

Systems according to the invention are preferably used in the deep UV range, for example at 248 nm, 193 nm or 157 nm or less.

These and other features are disclosed by the claims as well as by the description and the drawings, and the individual features may respectively be implemented separately or together to form sub-combinations in embodiments of the invention and for other fields, and may constitute both advantageous and per se protective versions.

DETAILED DESCRIPTION OF PREFERRED EMBODIMENTS

Figure 1:
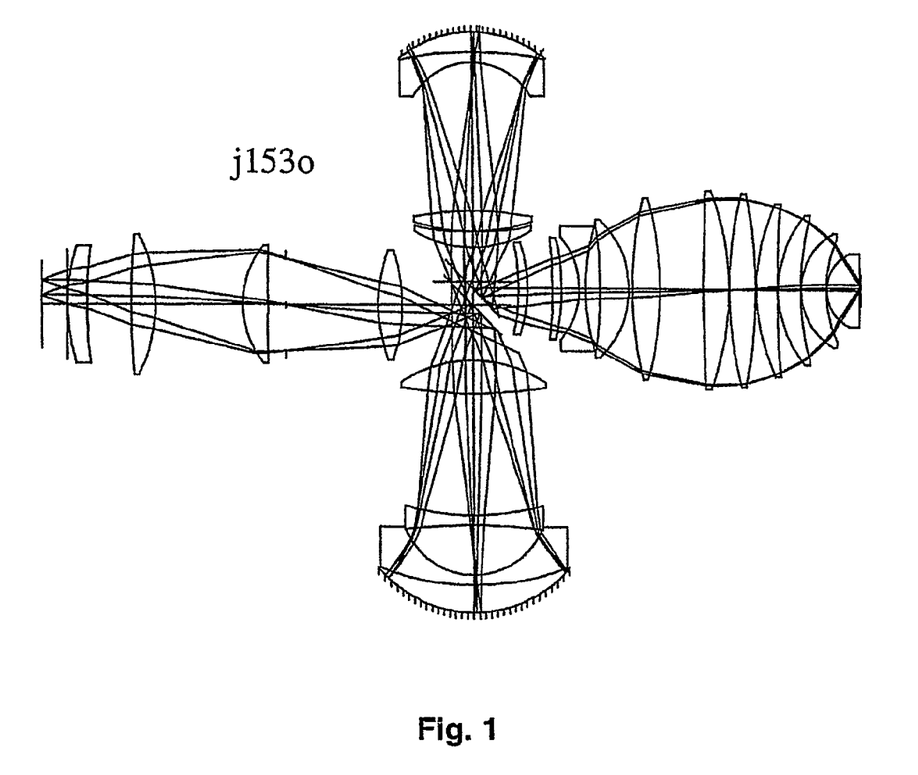
FIG. 1 shows a first embodiment of a projection objective according to the invention with an asymmetrical structure.
Figure 2:
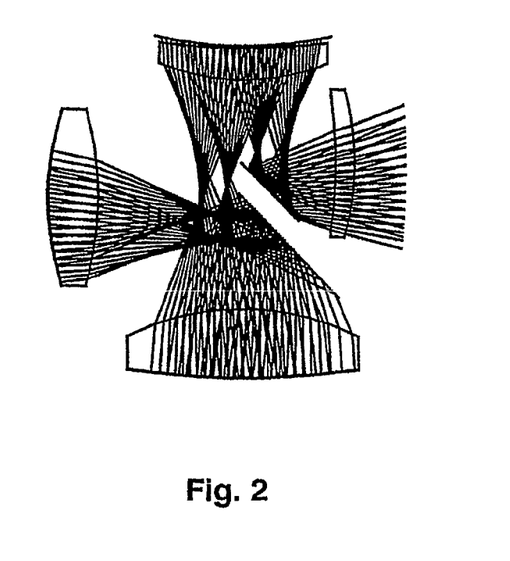
FIG. 2 shows a detailed view of the folding instrument in FIG. 1

FIG. 1 shows a first embodiment of a projection objective according to the invention. FIG. 2 shows a detailed view of the region of the beam deflection device (folding arrangement or folding device).

This system has the following parts in the light propagation direction: from the reticle (object plane (on the left in the figure) the light propagates through the first refractive part (R1) onto a folding mirror (F1), which is located in the vicinity of the first intermediate image (ZB1). The first folding mirror F1 reflects the light into a first (downward pointing) catadioptric part (HOA1). This part may be aligned essentially horizontally during operation. Such objective parts are also referred to below as a horizontal arm (HOA). This HOA1 projects the light onto a second intermediate image (ZB2) in the vicinity of the folding mirror (F1, F2). The light then passes through the other second catadioptric part (HOA2), on the top in the drawing, which in turn generates an intermediate image (third intermediate image ZB3). ZB3 is projected directly, that is to say without another intermediate image, onto the wafer by the second refractive part (R2).

The following features are provided and can be seen from the representation: The design comprises exactly three real intermediate images. There are therefore 3+1=4 possible positions of aperture diaphragms (real pupil positions), namely in the relay system R1, in the vicinity of the concave mirrors S1, S2 and in the fourth subsystem R2. In this special exemplary embodiment, the aperture diaphragm is in R1.

The folding mirrors are located in the vicinity of the intermediate images, which minimizes the etendue (the object is minimally off-axial). The intermediate images (that is to say the entire region between the paraxial intermediate image and the peripheral-beam intermediate image) do not lie on the mirror surfaces, however, so that possible defects of the mirror surfaces are not projected sharply into the image plane.

The folding angles are exactly 90° in this special exemplary embodiment, and in particular no more than 90°. This is favorable for the performance of the mirror layers of the folding mirrors (see below).

The reticle plane (plane of the object field) is not affected by the mouting technique. Truncated lenses are unnecessary. The performance data of the system for a full field (26×5.5 mm2) and NA 1.3 are about 7.5 mλ with a blank mass of about 90 kg SiO$_2$. This is a value as yet unachievable with refractive designs or h-designs. The lens diameters (optically free) are significantly less than 300 mm.

The following features may respectively be favorable on their own or in combination with other features. The design contains four field lenses with a positive refractive power, each in the immediate vicinity of the folding arrangement. There should be at least one negative lens in one of the two HOAs, in order to ensure the chromatic correction. There may be at least one negative lens in each catadioptric part, preferably in the immediate vicinity of the concave mirror. Favorable variants contain at least three lenses passed through two times (in the exemplary embodiment which is shown, there are six lenses passed through two times, namely the $2^{nd}$ and $3^{rd}$ field lenses and at least one other negative lens in front of one of the two mirrors for the CHL correction.

Favorable variants involve little negative refractive power in the refractive parts (in the exemplary embodiment, essentially a negative lens in R2).

The design has strong coma in the intermediate images, especially in the third intermediate image ZB3. This helps to correct the sine condition in the image space without surfaces having large angles of incidence in R2.

Table 1 summarizes the specification of the design in a tabular form. In this table, column 1 indicates the number of the refracting, reflecting or otherwise noteworthy surface, column 2 denotes the radius r of the surface (in mm), column 3 denotes the distance d from the surface to the next surface (in mm), which is referred to as the thickness, column 4 denotes the material of a component and column 5 indicates the refractive index of the material of the component that follows the specified entry surface. Column 6 indicates the optically useful half free diameters of the optical components (in mm).

Table 2 indicates the corresponding aspherical data, the rising heights (sagitta) of the aspherical surfaces being calculated according to the following rule:

$$p(h)=[((1/r)h^2/(1+SQRT(1-(1+K)(1/r)^2h^2)]+C1*h^4+C2*h^6+\ldots$$

Here, the inverse (1/r) of the radius indicates the surface curvature at the surface vertex and h indicates the distance of a surface point from the optical axis. p(h) thus indicates this rising height, that is to say the distance of the surface point from the surface vertex in the z direction, i.e. in the direction of the optical axis. The constants K, C1, C2 are given in Table 2.

TABLE 1

| Surface | Radius | Thickness | Glass | Index@193 | Hmax |
|---|---|---|---|---|---|
| 0 | 0.000000 | 40.000000 | | | 63 |
| 1 | 0.000000 | 0.000000 | | | 74.812 |
| 2 | 280.911554 | 29.101593 | SIO2 | 1.56029525 | 78.206 |
| 3 | 1315.352634 | 67.564457 | | | 79.868 |

TABLE 1-continued

| Surface | Radius | Thickness | Glass | Index@193 | Hmax |
|---|---|---|---|---|---|
| 4 | 1226.076021 | 36.889857 | SIO2 | 1.56029525 | 94.337 |
| 5 | −224.620142 | 132.650952 | | | 95.649 |
| 6 | 132.557450 | 37.873616 | SIO2 | 1.56029525 | 81.937 |
| 7 | −1652.923938 | 26.883045 | | | 78.866 |
| 8 | 0.000000 | 138.896699 | | | 67.638 |
| 9 | 175.542348 | 36.333740 | SIO2 | 1.56029525 | 75.651 |
| 10 | −236.570865 | 100.002684 | | | 75.039 |
| 11 | 0.000000 | 9.995756 | | | 59.032 |
| 12 | 0.000000 | −81.094895 | REFL | | 110.211 |
| 13 | −208.565918 | −48.990866 | SIO2 | −1.56029525 | 104.471 |
| 14 | 517.535257 | −178.643431 | | | 104.642 |
| 15 | 398.156640 | −15.000000 | SIO2 | −1.56029525 | 100.231 |
| 16 | −950.114340 | −73.251055 | | | 103.344 |
| 17 | 116.287221 | −15.000000 | SIO2 | −1.56029525 | 104.039 |
| 18 | 473.502609 | −41.360609 | | | 140.152 |
| 19 | 194.854755 | 41.360609 | REFL | | 143.288 |
| 20 | 473.502609 | 15.000000 | SIO2 | 1.56029525 | 139.289 |
| 21 | 116.287221 | 73.251055 | | | 99.401 |
| 22 | −950.114340 | 15.000000 | SIO2 | 1.56029525 | 92.823 |
| 23 | 398.156640 | 178.645431 | | | 87.639 |
| 24 | 517.535257 | 48.990866 | SIO2 | 1.56029525 | 84.803 |
| 25 | −208.565918 | 81.097016 | | | 83.851 |
| 26 | 0.000000 | 84.970261 | | | 59.404 |
| 27 | 176.145326 | 23.179878 | SIO2 | 1.56029525 | 79.591 |
| 28 | 756.736803 | 0.944155 | | | 79.8 |
| 29 | 314.641675 | 30.039119 | SIO2 | 1.56029525 | 80.579 |
| 30 | −500.071834 | 218.126390 | | | 80.744 |
| 31 | −108.651460 | 15.000000 | SIO2 | 1.56029525 | 80.556 |
| 32 | −785.250977 | 30.057005 | | | 106.274 |
| 33 | −182.598151 | −30.057005 | REFL | | 109.565 |
| 34 | −785.250977 | −15.000000 | SIO2 | −1.56029525 | 107.546 |
| 35 | −108.651460 | −218.126390 | | | 87.013 |
| 36 | −500.071834 | −30.039119 | SIO2 | −1.56029525 | 88.079 |
| 37 | 314.641675 | −0.94415S | | | 87.604 |
| 38 | 756.736803 | −23.179878 | SIO2 | −1.56029525 | 86.42 |
| 39 | 176.145326 | −49.965147 | | | 85.965 |
| 40 | 0.000000 | −10.012234 | | | 62.226 |
| 41 | 0.000000 | 69.993842 | REFL | | 66.12 |
| 42 | −340.701792 | 14.476713 | SIO2 | 1.56029525 | 61.548 |
| 43 | −198.092016 | 38.433493 | | | 63.405 |
| 44 | −681.785807 | 14.078463 | SIO2 | 1.56029525 | 69.045 |
| 45 | −317.005432 | 27.751722 | | | 70.244 |
| 46 | −110.357531 | 9.500172 | SIO2 | 1.56029525 | 70.916 |
| 47 | 311.063100 | 22.414990 | | | 86.59 |
| 48 | −1344.254472 | 43.792412 | SIO2 | 1.56029525 | 90.705 |
| 49 | −138.390126 | 5.810077 | | | 97.254 |
| 50 | 552.864897 | 42.476541 | SIO2 | 1.56029525 | 127.381 |
| 51 | −483.961511 | 63.875640 | | | 129.334 |
| 52 | 1021.980459 | 38.430027 | SIO2 | 1.56029525 | 142.111 |
| 53 | 410.501933 | 0.936239 | | | 142.917 |
| 54 | 578.822230 | 39.856519 | SIO2 | 1.56029525 | 139.665 |
| 55 | −723.060175 | 0.932875 | | | 138.387 |
| 56 | 283.549462 | 33.604225 | SIO2 | 1.56029525 | 124.246 |
| 57 | 1607.080204 | 0.891917 | | | 120.727 |
| 58 | 167.944629 | 33.588386 | SIO2 | 1.56029525 | 106.594 |
| 59 | 370.375071 | 0.941416 | | | 101.486 |
| 60 | 94.822236 | 39.056245 | SIO2 | 1.56029525 | 80 |
| 61 | 175.331402 | 0.944860 | | | 70.631 |
| 62 | 58.889747 | 49.845949 | SIO2 | 1.56029525 | 50.337 |
| 63 | 0.000000 | 2.000000 | H2OV193 | 1.4368226 | 19.381 |
| 64 | 0.000000 | −0.000335 | H2OV193 | 1.4368226 | 15.75 |
| 65 | 0.000000 | 0.000335 | | | 15.75 |

TABLE 2

| Surface | 3 | 7 | 9 | 14 = 24 | 18 = 20 |
|---|---|---|---|---|---|
| K  | 0 | 0 | 0 | 0 | 0 |
| C1 | 2.886968E−08 | 6.178555E−08 | −1.273482E−07 | −2.178828E−08 | 1.372393E−08 |
| C2 | 1.135834E−12 | 6.960497E−13 | 4.938210E−12 | −2.747119E−13 | −3.413863E−13 |
| C3 | 2.526440E−17 | −5.947244E−17 | −3.380917E−16 | 2.007136E−17 | 1.076781E−17 |
| C4 | −2.060922E−21 | 3.751921E−20 | 1.794088E−20 | 1.731842E−21 | −3.258468E−22 |
| C5 | −7.650561E−25 | −4.325897E−24 | −1.057449E−25 | −2.027055E−25 | 6.466061E−27 |
| C6 | 5.723867E−29 | 7.686244E−29 | 2.539541E−30 | 5.423640E−30 | −5.896986E−32 |

| Surface | 28 = 38 | 32 = 34 | 48 | 52 | 57 |
|---|---|---|---|---|---|
| K  | 0 | 0 | 0 | 0 | 0 |
| C1 | 7.190084E−08 | −3.011106E−08 | −5.7S7903E−08 | −3.792122E−08 | −2.413143E−08 |
| C2 | −5.639061E−13 | 1.342687E−12 | 1.903176E−12 | 1.535276E−12 | 2.795676E−12 |
| C3 | 9.086478E−18 | −6.959794E−17 | −7.267601E−17 | −1.992532E−17 | −1.365078E−16 |
| C4 | 8.555051E−22 | 3.712216E−21 | 1.940515E−21 | −4.676144E−22 | 5.749863E−21 |
| C5 | −2.763206E−26 | −1.392566E−25 | −1.899677E−25 | 2.069154E−26 | −1.655627E−25 |
| C6 | −9.351012E−31 | 2.691744E−30 | −4.747025E−30 | −2.314945E−31 | 2.725293E−30 |

Figure 3:
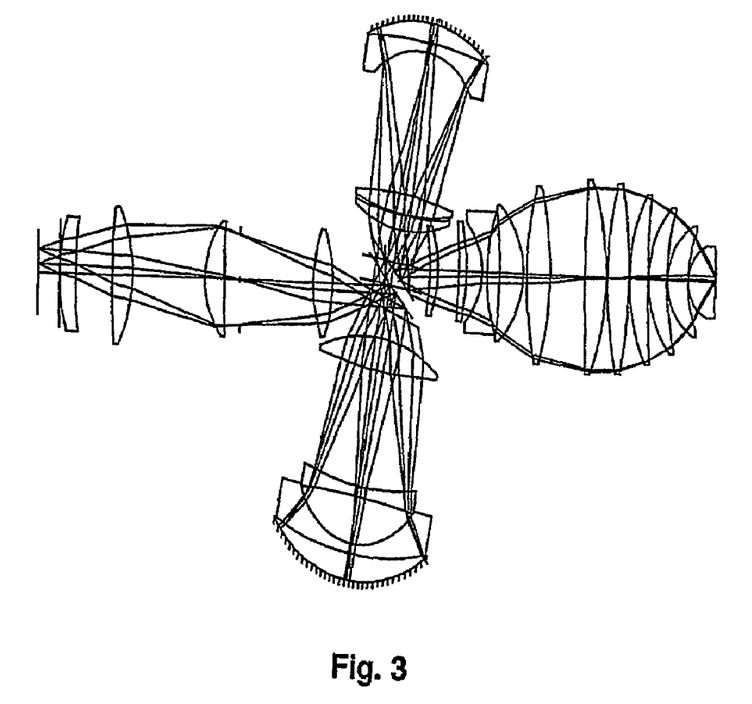
FIG. 3 shows a variant of the system shown in FIG. 1.

Numerous variants are possible. FIG. 3 represents a relevant variant by way of example with a suitable catadioptric subsystem (HOA) for more favorable mirror layers. In the embodiment, the HOA is inclined by 20° from the horizontal. The angle of incidence on the folding mirrors can be further reduced in this way:

In principle, the order of the folding mirrors may also be interchanged. As shown here: the optical path first crosses the beam from HOA1 to HOA2 before the fold 1, then the beam is folded by F2 into R2 without crossing. This variant permits a shorter overall length in R2 with the large protruding convexity.

The beam splitting shown here with two plane mirrors may be replaced by a beam splitter cube (SmallCube). In this case, however, it is necessary to bear in mind that any deviation of the beam splitter layer from 100% reflectivity at the first reflection could lead to a scattered light problem on the wafer. Possible problems due to birefringence in the beam splitter material may be kept small by suitable compensation measures.

Figure 4:
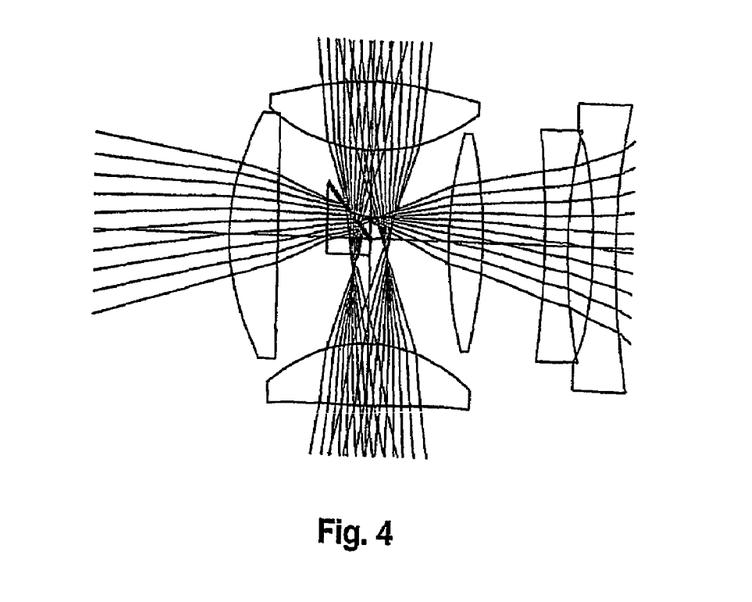
FIG. 4 shows another folding instrument with prisms

The system shown in FIG. 1 is configured so that the two plane folding mirrors are positioned at a small distance from each other, back to back. Under certain circumstances, this may be done using a single double-mirrored body. In principle, it is also possible for the beam deviation to be carried out with a solid prism, as shown in FIG. 4. Here, the light first enters the folding prism and the first folding reflection takes place at the hypotenuse surface of the prism. After passing through the HOA1 and HOA2, the second folding reflection takes place at the same hypotenuse surface, but on its rear side.

It should be mentioned that CaF2 must be selected for this prism owing to lens heating reasons. With a refractive index of n=1.5 at 193 nm and the NA of about 0.3 existing at the intermediate image, however, total reflection over the entire beam cross section is not realistic so that a high-performance reflection layer needs to be applied to the hypotenuse.

Concerning the imaging scale: in principle, different imaging scales of the projection objective are possible, in particular 4×, 5×, 6×. Larger imaging scales (for example 5× or 6×) may be favorable since they reduce the aperture on the object side and therefore relax the folding geometry.

The relay system R1 (first subsystem) need not necessarily have an imaging scale of close to 1:1, likewise HOA1 and HOA2. Here, in particular, a magnifying first objective part R1 may be favorable in order to relax the folding geometry.

The system shown in FIG. 1 is configured as an immersion objective. For example, ultrapure water may be suitable as an immersion medium for 193 nm it is also possible to configure projection objectives according to the invention as a dry objective, for example at NA 0.95, with a finite working distance on the wafer.

The above embodiments have two purely refractive and two catadioptric system groups and three intermediate images, the two catadioptric subsystems being constructed differently.

The subsystems will also be referred to below as lens modules. The systems have four lens modules M1, M2, M3 and M4. The first lens module M1 with a positive refractive power has the reticle as its object and forms the intermediate image ZB1. This first intermediate image is the object for the second lens module catadioptric M2 with a positive refractive power, which forms the intermediate image ZB2. This second intermediate image is the object for the catadioptric lens module M3 with a positive refractive power, which forms the intermediate image ZB3. The lens module M4 with a positive refractive power images ZB3 onto the wafer (W).

The the refractive front system (first subsystem, relay system) is constructed asymmetrically. The distance between the two plane deviating mirrors (folding mirrors) should be small so that the object-image shift (OIS), that is to say the lateral offset between the optical axis on the object side and the optical axis on the image side, remains small.

Figure 5:
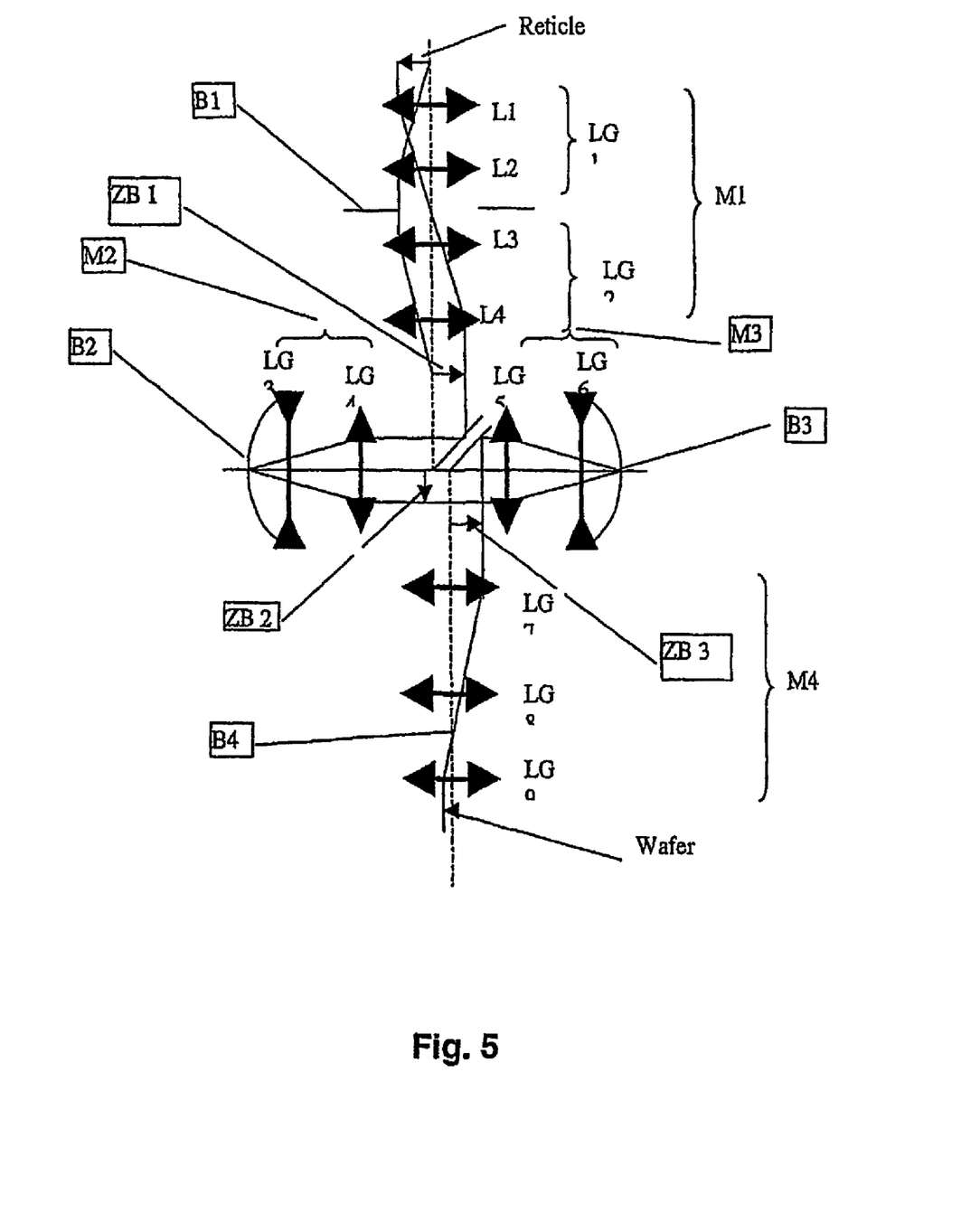
FIG. 5 shows another embodiment of a projection objective according to the invention with a substantially symmetrical structure.

There are embodiments which can offer advantages here. An example is shown in FIG. 5.

The lens module M1 consists of a first lens group LG1 with a positive refractive power and a second lens group LG2 with a positive refractive power. The main beam intersects the optical axis between these two lens groups. A preferred diaphragm plane B1 is obtained there.

The first lens group LG1 preferably consists of at least two positive lenses: at least one lens L1 near the field and at least one lens L2 near the aperture.

The second lens group LG2 consists of at least two lenses: at least one lens L3 near the field and at least one lens L4 near the aperture.

The following conditions are preferably fulfilled, not necessarily at the same time but preferably at the same time:

LG1=LG2

L1=L2=L3=L4

L1=L4; L2=L3

Here, the equality of two lenses is to be understood as equality of their radii. The lenses may thus have unequal thicknesses. The lenses should be producible with the same tool. Equality of the groups as equality of their lenses. Such systems offer advantages for fabrication, since production and testing of the lenses are simplified.

The arrangement of these lenses may be symmetrical or asymmetrical with respect to a plane perpendicular to the optical axis. A symmetrical structure with respect to the diaphragm plane B1 is preferred here. The arrangement of the aperture diaphragm is preferably in this plane. This arrangement is advantageous since it does not introduce any asymmetrical image errors into the intermediate image ZB1.

The imaging scale $\beta$ of the first lens module M1 is preferably $\beta=1$.

Preferably, the first lens module is substantially constructed symmetrically but is operated asymmetrically ($\beta \neq 1$). The advantage of this quasi-symmetrical arrangement is the introduction of a value of the chromatic magnification difference needed for the further correction and other asymmetric image errors (primarily coma).

The lens L1 preferably carries an asphere in order to correct the telecentry in the object space.

One of the lenses L3 and/or L4 preferably carries at least one asphere in order to correct the spherical aberration in the first intermediate image. This relaxes the folding geometry and allows a small etendue (geometrical light guidance value).

Figure 6:
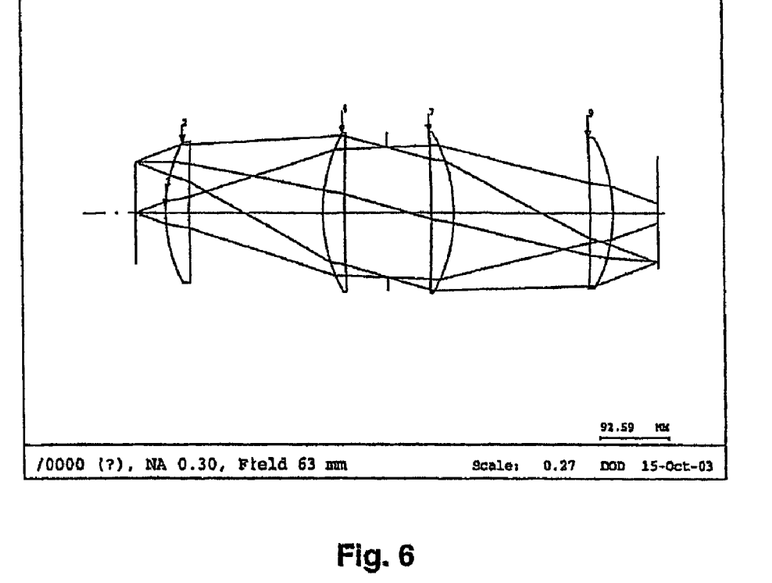
FIG. 6 shows a relay system with small image field curvature.

The first lens module M1 is preferably constructed in a "low-Petzval" form, that is to say with lenses having a reduced Petzval sum. A "low-Petzval structure can be produced by using lenses with a low Petzval sum, in particular suitable menisci. The telecentry, spherical aberration and astigmatism are corrected by aspheres on the lenses 1 and 2 or 3 and 4. A possible structure is shown in FIG. 6. Table 3 gives the specification of this first subsystem.

close to the mirror surface, the the image field curves away from the mirror surface. This relaxes the folding geometry and allows a small etendue.

The lens modules M1 and M2 are preferably constructed in a double-telecentric form. This makes it possible to correct the astigmatism in the second and third intermediate images.

Preferably, the first lens module does not have any negative lenses.

In another preferred embodiment, it is advantageous to correct or greatly reduce the Petzval sum in the first lens module M1 as well. Negative lenses near the object or near the image may be used for this.

The two catadioptric lens modules M2 and M3 are preferably constructed in an axially symmetric form (all lenses passed through two times).

They preferably consist of a positive lens group LG3 (LG5) close to the corresponding intermediate image, and a negative lens group LG4 (LG6) close to the concave mirrors. The main beam intersects the optical axis again on the two concave mirrors. This provides another two preferred diaphragm positions B2 and B3.

The lens groups LG3 and LG5 preferably consist of one or two positive lenses, and the lens groups LG4 and LG6 preferably consist of fewer than or at most three negative lenses.

The following conditions are preferably fulfilled individually or in groups:

LG3=LG5

LG4=LG6

S2=S3

TABLE 3

| SURFACE; | RADII;; | THICKNESSES; | GLASSES; | INDEX; | DIAM.;; | |
|---|---|---|---|---|---|---|
| 0; | 0.000000000; ; | 40.000000000; | | ; 1.00000000; | 63.000; | REFR; |
| 1; | 0.000000000; ; | 0.000000000; | | ; 1.00000000; | 77.307; | REFR; |
| 2; | 190.000000000; ; | 30.000000000; | SILUV | ; 1.56049116; | 84.376; | REFR; |
| 3; | 2000.000000000; ; | 180.000000000; | | ; 1.00000000; | 84.608; | REFR; |
| 4; | 190.000000000; ; | 30.000000000; | SILUV | ; 1.56049116; | 95.633; | REFR; |
| 5; | 2000.000000000; ; | 60.000000000; | | ; 1.00000000; | 94.546; | REFR; |
| 6; | 0.000000000; ; | 60.000000000; | | ; 1.00000000; | 80.655; | REFR; |
| 7; | −2000.000000000; ; | 30.000000000; | SILUV | ; 1.56049116; | 96.106; | REFR; |
| 8; | −190.000000000; ; | 180.000000000; | | ; 1.00000000; | 97.226; | REFR; |
| 9; | −2000.000000000; ; | 30.000000000; | SILUV | ; 1.56049116; | 90.900; | REFR; |
| 10; | −190.000000000; ; | 60.000000000; | | ; 1.00000000; | 90.869; | REFR; |
| 11; | 0.000000000; ; | 0.000000000; | | ; 1.00000000; | 63.064; | REFR; |
| 12; | 0.000000000; ; | 0.000203080; | | ; 1.00000000; | 63.064; | REFR; |

In general, the distance between the mirror surfaces and the closest intermediate image should lie between a finite minimum distance and a maximum distance. The maximum distance may, for example, be 1/10 or 1/15 or 1/20 of the system length. The minimum distance should be small compared with it.

The first lens module M1 should preferably be spherically overcorrected if the first folding mirror S1 is located after the paraxial intermediate image (ZB1) and spherically undercorrected if the paraxial intermediate image (ZB1) is located after the folding mirror S1. This ensures that the intermediate image does not lie on the mirror surface.

The Petzval sum is preferably adjusted so that the foci of the outermost field point and of the innermost field point are located approximately at the same distance from the first folding mirror. The intermediate image can then be brought where S2 and S3 are concave mirrors, and equality of the groups is to be understood as equality of their lenses.

The aberration load (Petzval and CHL) is thus distributed over the two lens modules. This structure is of great advantage since the refractive powers and therefore the aberration contributions are minimized.

The two lens modules M2 and M3 are also preferably operated quasi-symmetrically ($\beta$ slightly different to 1). This allows a simple correction of the CHV for the entire system.

In another preferred arrangement, the lens groups LG3 and LG5 each consist of two positive lenses. Two equal lenses are preferred. This relaxes the aberration contributions of these lens groups.

A structure of the lens modules M2 and M3 is also preferred such that the Petzval sum of the refractive lens elements of the lens groups LG3 and LG4 in the lens module M2 and LG5 and LG6 in the lens module M3 compensate for each other. In particular, the following may apply:

$$(-PTZ(S2)/8) < PTZ(LG3+LG4) < (PTZ(S2)/8)$$

and $$(-PTZ(S3)/8) < PTZ(LG5+LG6) < (PTZ(S3)/8)$$

Primarily the Petzval contributions of the concave mirrors S2 and S3 thus remain for the compensation of the Petzval curvature of the lens modules M1 and M4.

At least one of the lenses of the groups LG4 and/or LG6 or the mirrors S2 and/or S3 preferably each carry an asphere. This makes it possible to correct the spherical aberration in the intermediate images ZB2 and ZB3, and thus to relax the folding and therefore reduce the etendue.

The fourth lens module M4 is preferably made up of three lens groups: A first lens group LG7 near the field, a second lens group LG8 and a third lens group LG9. The main beam intersects the optical axis between the lens groups LG8 and LG9, and thus forms a fourth preferred diaphragm plane B4.

LG8 preferably contains at least one surface which is curved relative to the image plane with large beam angles. As a lens surface on the image side, this may belong to a negative meniscus lens or to a negative biconcave lens. This essentially contributes to the correction of the sine condition.

Preferably, the lens group LG9 does not have any negative lenses.

The last three lens elements are preferably made of CaF2 with different crystal orientations.

The two inverting mirrors S1 and S3 are preferably constructed as a single plane-parallel plate reflecting on both sides. It should preferably consist of a highly transparent material. This makes it easy to check the parallelism before the reflecting layers are applied. The preferred material for the folding mirror is SiO2

Such a structure makes it possible to reduce the distance between the two mirrors and therefore to reduce the OIS (object image shift).

Figure 7:
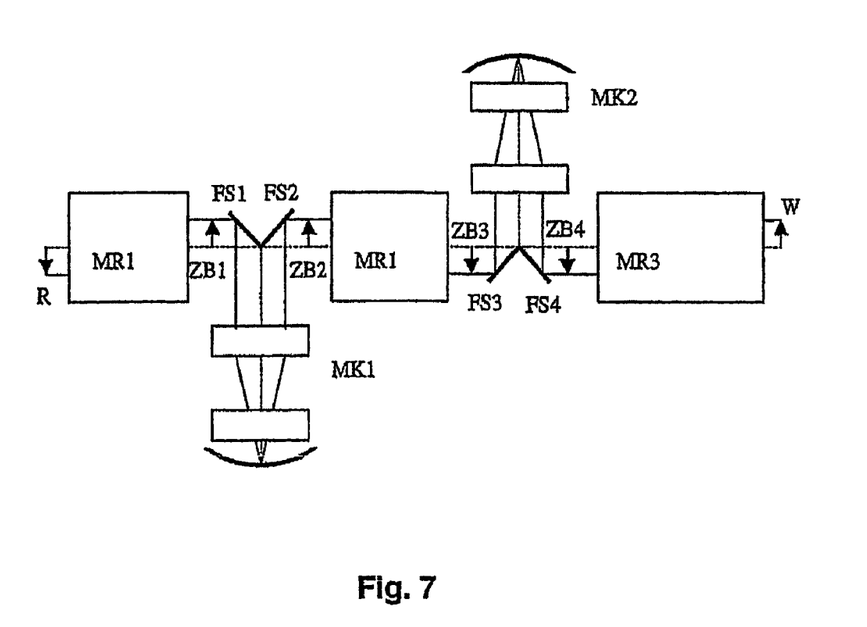
FIG. 7 shows another embodiment of a projection objective according to the invention.
Figure 8:
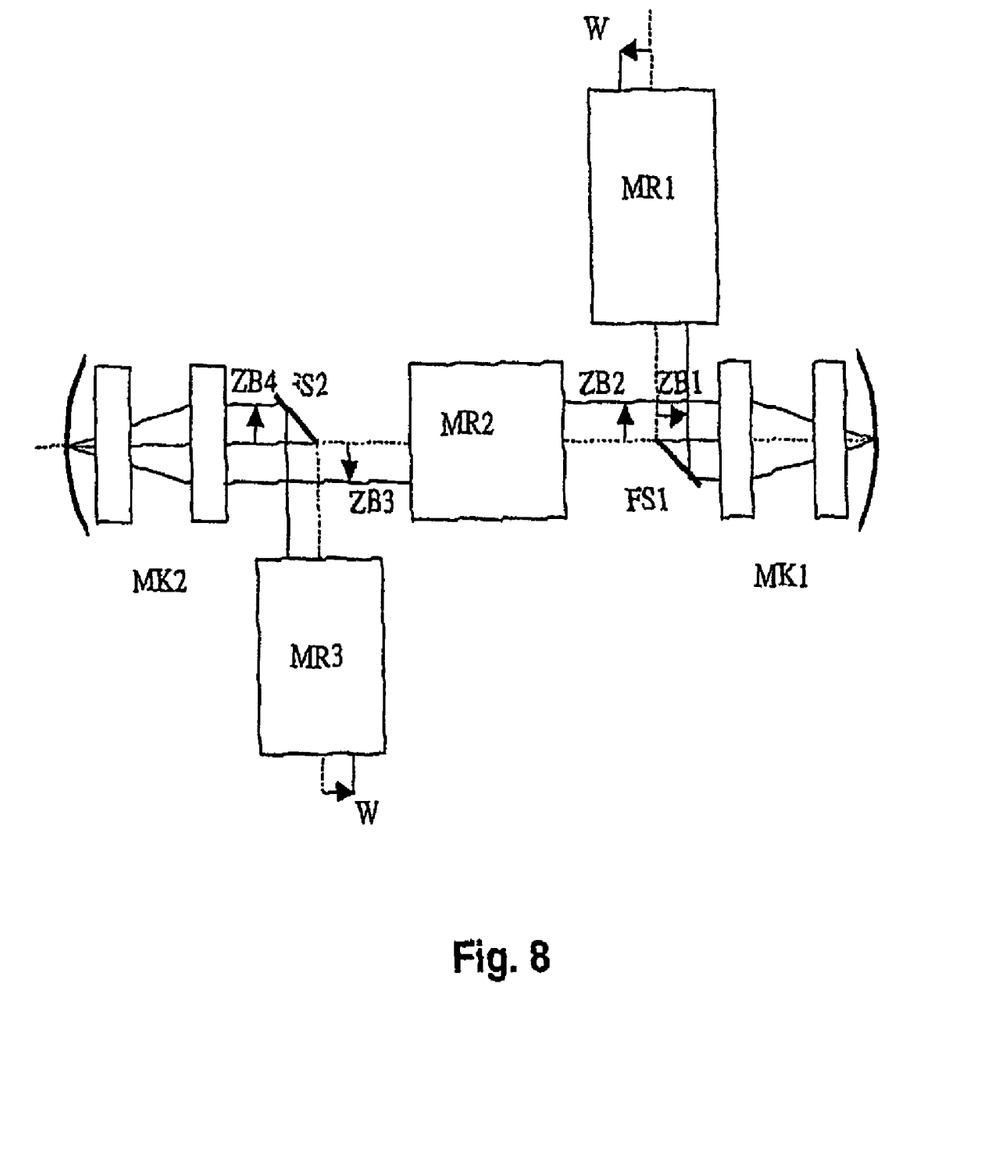
FIG. 8 shows another embodiment of a projection objective according to the invention.
Figure 9:
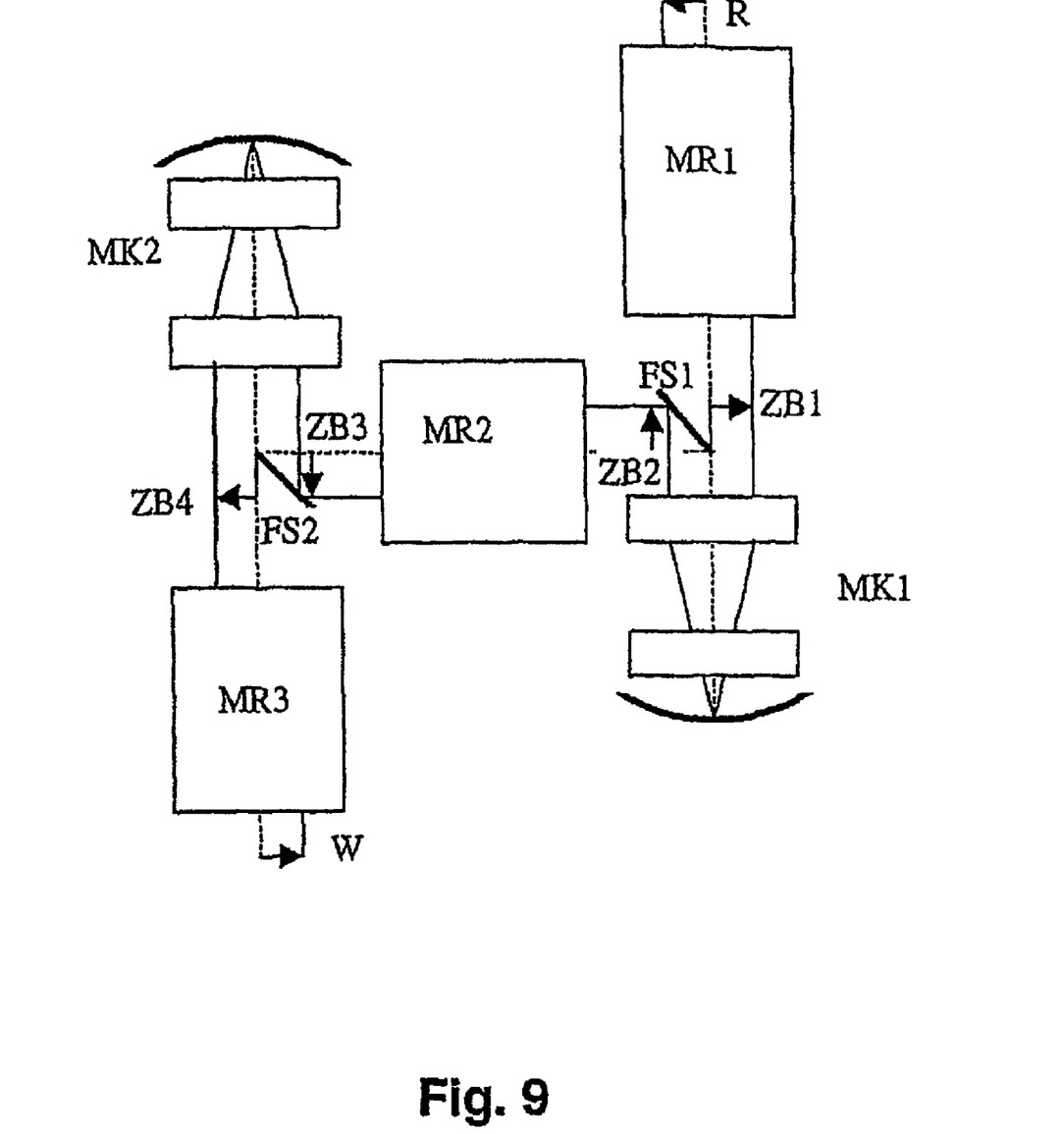
FIG. 9 shows another embodiment of a projection objective according to the invention.
Figure 10:
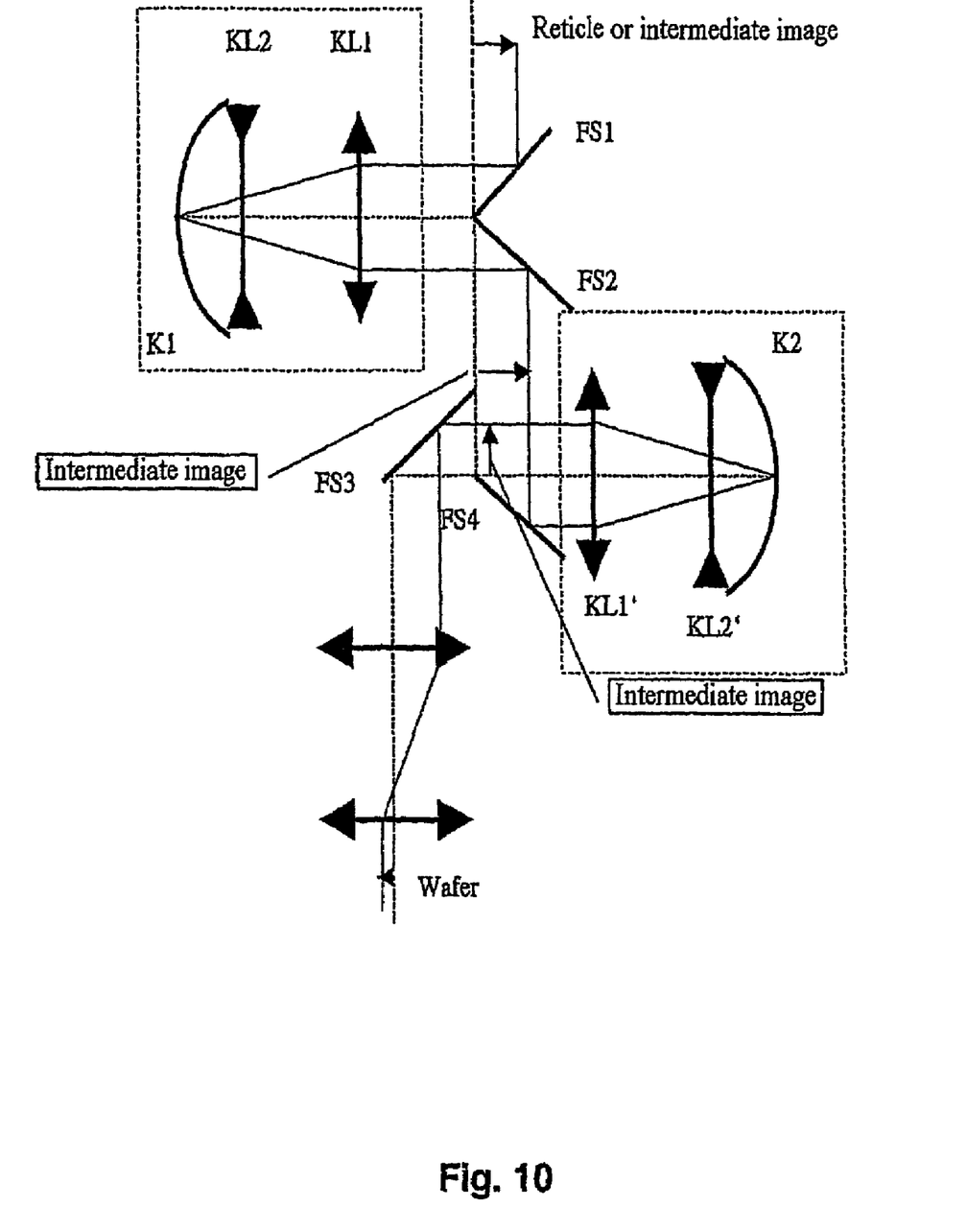
FIG. 10 shows an embodiment of a projection objective according to the invention with decoupled optical axes of the catadioptric systems.

Systems having more than three intermediate images are also possible in the scope of the invention. These may offer further degrees of design freedom in order to optimize the required space and the optical correction. FIGS. 7, 8 and 9 show embodiments of such systems as examples.

These systems have the following lens modules:
two purely refractive lens modules MR1 and MR2 with β≈1
two catadioptric modules MK1 and MK2 with β≈1
a refractive module MR3 with β∈[1/3, 1/6]

each module having a real object and providing a real image with an imaging scale β.

By coupling these four modules together, an imaging scale is obtained with β∈[1/3, 1/6].

FIG. 7 represents a system structure in which all three refractive modules are arranged on one axis with a reticle and a wafer. The reticle R is projected by the lens module MR1 into the first intermediate image ZB1. The catadioptric module MK1 projects the first intermediate image into the second intermediate image ZB2. The second refractive module MR2 projects the second intermediate image into the third real intermediate image ZB3. The latter is used as the object for the second catadioptric module MK2, which provides the fourth intermediate image ZB4. This last intermediate image is projected by the refractive system MR3 onto the wafer.

FIGS. 8 and 9 show two embodiments in which the axis of the reticle is located at a large distance from the axis of the wafer Other structures are conceivable. What characterizes all systems of this type, however, is the sequence of the modules: MR1-MK1-MR2-MK2-MR3. The axial orientation may optionally be determined by means of folding mirrors FS1, FS2, FS3, FS4.

The structure of the modules of these systems with four intermediate images corresponds to that of systems with three intermediate images in the following way: The modules MR1 and MR2 correspond to the module M1. The modules MK1 and MK2 correspond to the modules M2 and M3. The module MR3 corresponds to the module M4

The aberration compensation is also carried out in a similar way. The continuous line path corresponds to the primary beam of the outermost field.

The optical axes of the mirror groups, that is to say of the catadioptric subsystems, coincide in the systems presented so far, so that any inclination of one of the axes dictates the inclination of the others. This may mean that if one axis is inclined in order to make space, than the others will be inclined so that the available space becomes narrower again.

Various exemplary embodiments of optical imaging systems which can avoid these problems will be presented below. They may be used as independent systems or as subsystems inside a more complex catadioptric structure The (sub)system shown in FIG. 9 has two real intermediate images and, inter alia, the following characteristics: the optical axes of the catadioptric lens groups are decoupled from one another, so that they are not mutually coaxially but laterally offset from one another. The catadioptric subsystems K1 and K2 are constructed in an axially symmetric form. Each contains a positive lens group KL1 (KL1') near the object and a negative lens group KL2 (KL2') near the mirror.

For example, the system which is shown may be used as a subsystem which projects a first intermediate image of the object field, generated by a relay system of the type described above, into the image plane of the projection objective. The overall system then has three intermediate images.

According to another variant, the optical axes of the mirror groups can both be inclined in the direction of the wafer plane in this system. This increases the missing space between concave mirror and reticle plane.

Figure 11:
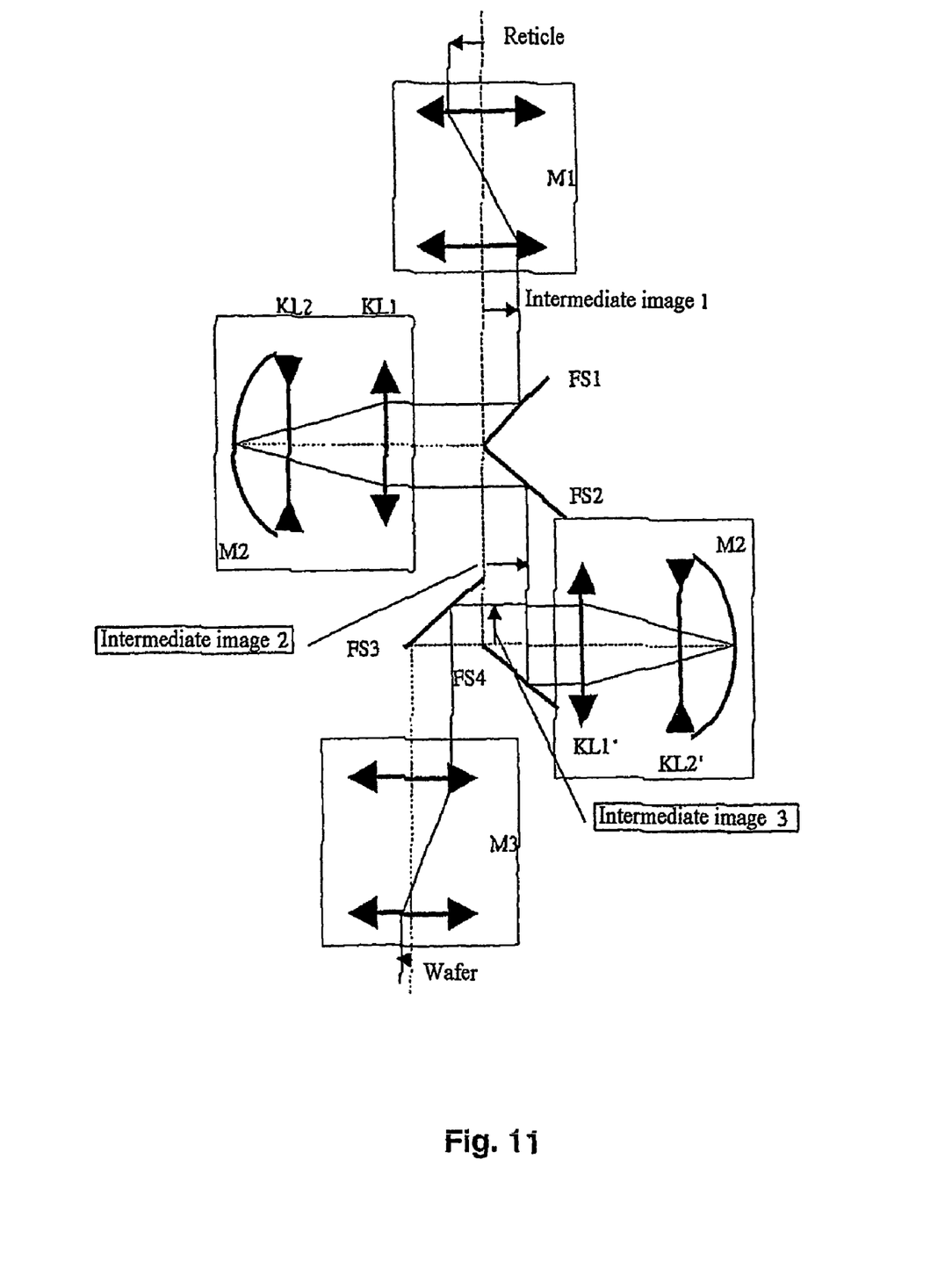
FIG. 11 shows another embodiment of a projection objective according to the invention with decoupled optical axes of the catadioptric systems.

A complete catadioptric system having three intermediate images and decoupled axes of the catadioptric parts will be explained with reference to FIG. 11. The system consists of four lens modules M1, M2, M3 and M4.. The first lens module M1 with a positive refractive power has the reticle as its object and forms the intermediate image ZB1. This first intermediate image is the object for the second catadioptric lens module M2 with a positive refractive power, which forms the intermediate image ZB2. This second intermediate image is the object for the catadioptric lens module M3 with a positive refractive power, which forms the intermediate image ZB3.

The catadioptric subsystems M2 and M3 are constructed in an axially symmetric form. Each contains a positive lens group KL1 (KL1') near the object and a negative lens group KL2 (KL2') near the mirror. The preferred structure of the subsystems may correspond to the variants described above.

Figure 12:
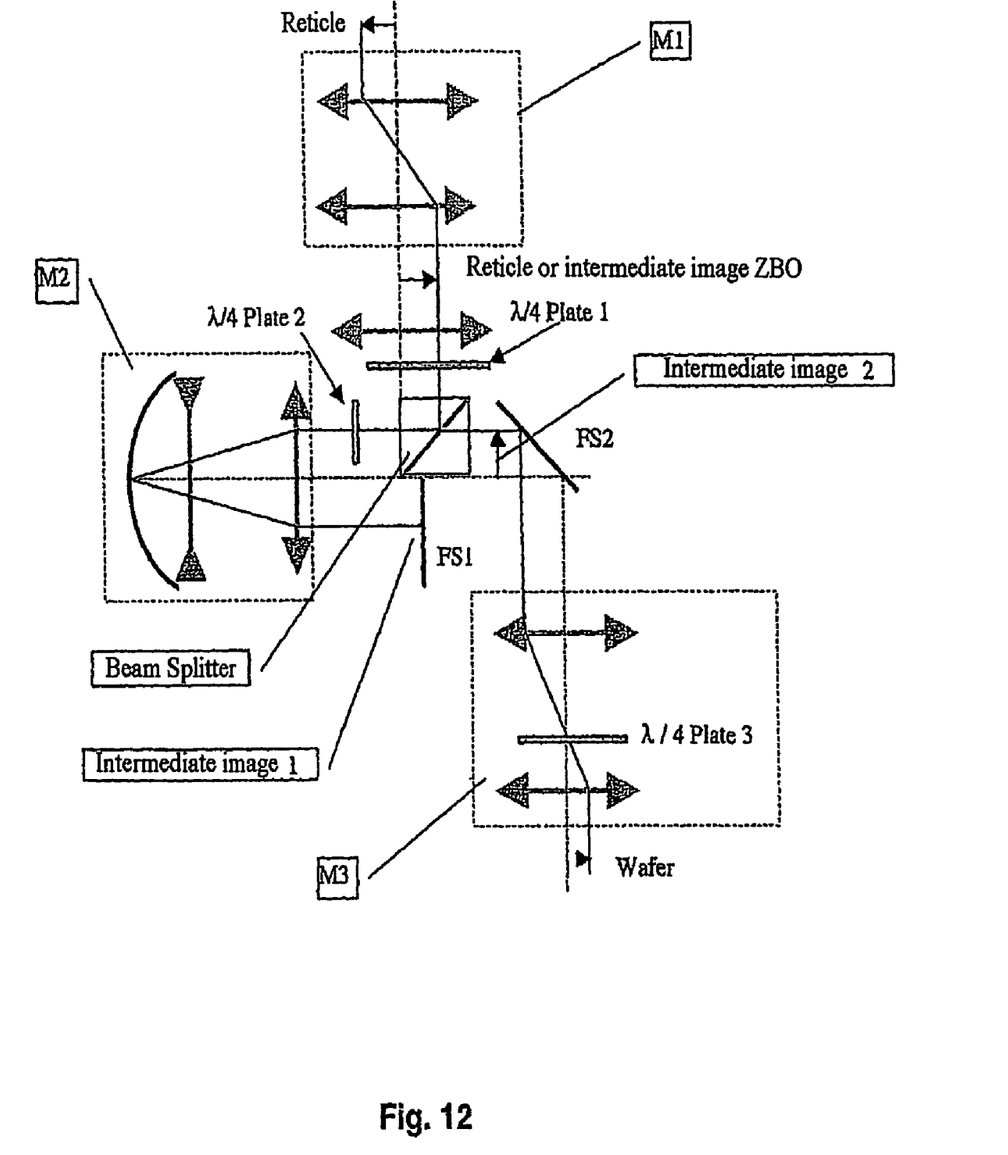
FIG. 12 shows another embodiment of a projection objective according to the invention with a polarization beam splitter and a catadioptric objective passed through two times.

A catadioptric projection objective having a polarization beam splitter and three intermediate images and with only one catadioptric objective part, albeit one which is passed through two times, will be explained with reference to FIG. 12.

The reticle (or a first intermediate image of the object field) is projected by a catadioptric system module M2 into an intermediate image ZB1. Here, the circularly incident light is linearly polarized by the first λ/4 plate, reflected by the polarization-selective semitransparent layer of the beam splitter, leaves the beam splitter and is then circularly polarized by a second λ/4 plate. The circularly polarized light is reflected by the concave mirror so that it changes its rotation direction, is reflected back again by the first folding mirror FS1, changes rotation direction again and is reflected once more at the concave mirror with a change in rotation direction. Before the light passes again through the second λ/4 plate, consequently, it has an opposite rotation direction to that during the first pass. The light therefore becomes linearly polarized, but the oscillation plane is perpendicular to the oscillation plane of the light after the first λ/4 plate. This makes it possible to transmit the light through the beam splitter and to form a subsequent intermediate image ZB2. This intermediate image is projected by the refractive lens module M3 onto the wafer with an imaging scale $\beta \in [1/6, 1/3]$.

If the space between the reticle and the beam splitter is too narrow, so that the reticle needs to be positioned further away from the beam splitter, which would lead to an increase in the etendue, it is advantageous for a first lens module M1 (relay system) which projects the reticle into an intermediate image ZB0 to be arranged between the reticle and the beam splitter.

The system modules M1 and M2 have an imaging scale $\beta \approx 1$.

Since the catadioptric group corrects both the image field curvature and the longitudinal chromatic aberration, it is advantageous for this system group to be passed through two times. Both the diameter and the refractive power in this group can thereby be reduced. The diameter of the concave mirror thus becomes smaller and therefore frees up space in the intermediate space toward the reticle.

An additional λ/4 plate in the vicinity of the third preferred diaphragm position in the lens module M3 ensures that the light impinges circularly on the wafer.

The folding mirror FS2 is arranged so that the reticle plane and the wafer plane extend parallel.

Two other preferred diaphragm positions are in the first module M1 and in the vicinity of the concave mirror.

If the first lens module is not used, then, particularly with large apertures (NA>0.8), it is advantageous to arrange a refractive front group of positive refractive power and imaging scale $\beta \approx 1$ between the reticle and the beam splitter, in order to position the resulting intermediate image closer to the beam splitter. This reduces the dimensions of the beam splitter.

The invention claimed is:

1. A catadioptric projection objective for projecting a pattern arranged in the object plane of the projection objective into the image plane of the projection objective, comprising:
    a first objective part projecting an object field lying in the object plane into a first real intermediate image;
    a second objective part generating a second real intermediate image with the radiation from the first objective part;
    a third objective part generating a third real intermediate image with the radiation from the second objective part; and
    a fourth objective part projecting the third real intermediate image into the image plane.

2. The projection objective as claimed in claim 1, wherein exactly three intermediate images are generated.

3. The projection objective as claimed in claim 1, wherein two of the objective parts are catadioptric, each having a respective concave mirror.

4. The projection objective as claimed in claim 1, wherein the first objective part is refractive, wherein the second objective part and the third objective part are designed as catadioptric systems, each of the systems having a respective concave mirror, and wherein a respective mirror surface is assigned to each of the concave mirrors in order either to deflect the radiation toward the respective concave mirror or to deflect the radiation coming from the respective concave mirror to a subsequent one of the objective parts.

5. The projection objective as claimed in claim 1, wherein all intermediate images are arranged proximate to a mirror surface.

6. The projection objective as claimed in claim 1, wherein all intermediate images are arranged distant from a mirror surface.

7. The projection objective as claimed in claim 1, wherein a maximum distance of one of the intermediate images from a mirror surface is less than 10% of a total length of the projection objective.

8. The projection objective as claimed in claim 1, wherein the first objective part is asymmetrical.

9. The projection objective as claimed in claim 1, wherein the first objective part is at least essentially symmetrical with respect to a plane perpendicular to the optical axis.

10. The projection objective as claimed in claim 1, wherein the first objective part has at least two lenses with lens surfaces that have the same radius.

11. The projection objective as claimed in claim 1, wherein the second objective part and the third objective part are asymmetrically constructed, one of the second and third objective parts being designed primarily for correcting field curvature and the other of the second and third objective parts being designed primarily for chromatic correction.

12. The projection objective as claimed in claim 1, wherein the second objective part and the third objective part are disposed essentially symmetrically with respect to one another.

13. The projection objective as claimed in claim 1, wherein a first catadioptric objective part has a first optical axis and a second catadioptric objective part has a second optical axis, and the first and second optical axes are arranged coaxially.

14. The projection objective as claimed in claim 1, wherein a first catadioptric objective part has a first optical axis and a second catadioptric objective part has a second optical axis, and the first and second optical axes are arranged offset with respect to one another.

* * * * *